(12) United States Patent
Tai et al.

(10) Patent No.: US 11,309,225 B2
(45) Date of Patent: Apr. 19, 2022

(54) FAN-OUT PACKAGE STRUCTURE AND METHOD OF MANUFACTURING THE SAME

(71) Applicant: Taiwan Semiconductor Manufacturing Co., Ltd., Hsinchu (TW)

(72) Inventors: Chih-Hsuan Tai, Taipei (TW); Chih-Hua Chen, Hsinchu County (TW); Hao-Yi Tsai, Hsinchu (TW); Yu-Chih Huang, Hsinchu (TW); Chia-Hung Liu, Hsinchu (TW); Ting-Ting Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 73 days.

(21) Appl. No.: 16/714,801

(22) Filed: Dec. 16, 2019

(65) Prior Publication Data

US 2020/0118900 A1  Apr. 16, 2020

Related U.S. Application Data

(63) Continuation of application No. 15/706,783, filed on Sep. 18, 2017, now Pat. No. 10,510,631.

(51) Int. Cl.
*H01L 23/31* (2006.01)
*H01L 21/66* (2006.01)
(Continued)

(52) U.S. Cl.
CPC .......... *H01L 23/3114* (2013.01); *H01L 21/56* (2013.01); *H01L 21/561* (2013.01);
(Continued)

(58) Field of Classification Search
CPC . H01L 25/043; H01L 25/0657; H01L 25/074; H01L 25/0756; H01L 25/117; H01L 25/0652; H01L 25/071; H01L 25/112; H01L 24/82; H01L 23/49827; H01L 23/5384; H01L 21/76898; H01L 23/481; H01L 21/76807–76813; H01L 2221/1015–1036; H01L 23/28–3192;
(Continued)

(56) References Cited

U.S. PATENT DOCUMENTS 9,000,584 B2  4/2015  Lin et al.
9,048,222 B2  6/2015  Hung et al.
(Continued)

OTHER PUBLICATIONS

"Office Action of Taiwan Counterpart Application", dated Sep. 21, 2020, p. 1-p. 3.

*Primary Examiner* — Nelson Garces
(74) *Attorney, Agent, or Firm* — JCIPRNET

(57) ABSTRACT

A package structure and a method of manufacturing the same are provided. The package structure includes a die, a redistribution layer (RDL) structure, a through integrated fan-out via (TIV) and a conductive terminal. The RDL structure is disposed on and electrically connected to the die. The TIV is laterally aside the die and extends to contact a bottom surface and a sidewall of a redistribution layer of the RDL structure. The conductive terminal is electrically connected to the die through the RDL structure and the TIV.

20 Claims, 14 Drawing Sheets

(51) Int. Cl.
- *H01L 21/56* (2006.01)
- *H01L 23/532* (2006.01)
- *H01L 23/00* (2006.01)
- *H01L 23/522* (2006.01)
- *H01L 21/78* (2006.01)
- *H01L 25/10* (2006.01)
- *H01L 21/683* (2006.01)
- *H01L 25/00* (2006.01)
- *H01L 23/538* (2006.01)
- *H01L 25/065* (2006.01)

(52) U.S. Cl.
CPC ........ *H01L 21/568* (2013.01); *H01L 21/6835* (2013.01); *H01L 21/78* (2013.01); *H01L 22/20* (2013.01); *H01L 22/32* (2013.01); *H01L 23/3128* (2013.01); *H01L 23/5226* (2013.01); *H01L 23/5389* (2013.01); *H01L 23/53209* (2013.01); *H01L 23/53238* (2013.01); *H01L 24/19* (2013.01); *H01L 24/20* (2013.01); *H01L 24/82* (2013.01); *H01L 24/92* (2013.01); *H01L 24/97* (2013.01); *H01L 25/105* (2013.01); *H01L 25/50* (2013.01); *H01L 24/29* (2013.01); *H01L 24/32* (2013.01); *H01L 24/48* (2013.01); *H01L 24/83* (2013.01); *H01L 25/0657* (2013.01); *H01L 2221/68345* (2013.01); *H01L 2221/68359* (2013.01); *H01L 2221/68372* (2013.01); *H01L 2224/04105* (2013.01); *H01L 2224/12105* (2013.01); *H01L 2224/16145* (2013.01); *H01L 2224/2919* (2013.01); *H01L 2224/32145* (2013.01); *H01L 2224/32225* (2013.01); *H01L 2224/48227* (2013.01); *H01L 2224/73265* (2013.01); *H01L 2224/73267* (2013.01); *H01L 2224/82005* (2013.01); *H01L 2224/83005* (2013.01); *H01L 2224/83101* (2013.01); *H01L 2224/92244* (2013.01); *H01L 2225/0651* (2013.01); *H01L 2225/06568* (2013.01); *H01L 2225/06596* (2013.01); *H01L 2225/1035* (2013.01); *H01L 2225/1041* (2013.01); *H01L 2225/1058* (2013.01); *H01L 2924/15311* (2013.01)

(58) Field of Classification Search
CPC ....... H01L 21/56–568; H01L 2224/281; H01L 23/3114; H01L 23/5226; H01L 2224/023–024; H01L 2224/02377; H01L 2224/02379; H01L 2224/28105
See application file for complete search history.

(56) References Cited

U.S. PATENT DOCUMENTS

| | | | |
|---|---|---|---|
| 9,048,233 | B2 | 6/2015 | Wu et al. |
| 9,064,874 | B2 | 6/2015 | Edelstein et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 2015/0145142 | A1 | 5/2015 | Lin et al. |
| 2015/0348904 | A1 | 12/2015 | Huang et al. |
| 2016/0163564 | A1* | 6/2016 | Yu .......................... H01L 24/92 257/774 |

* cited by examiner

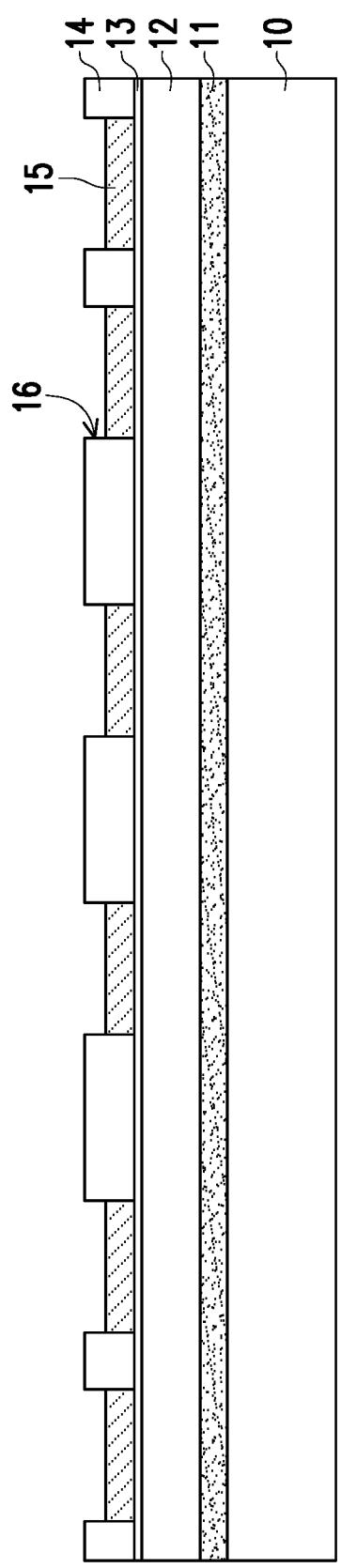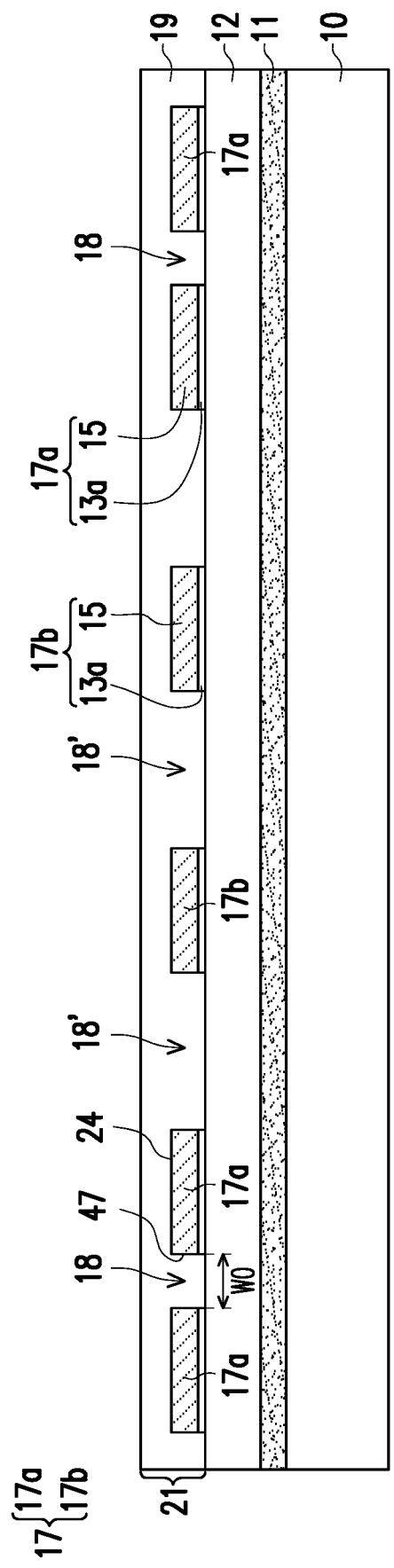

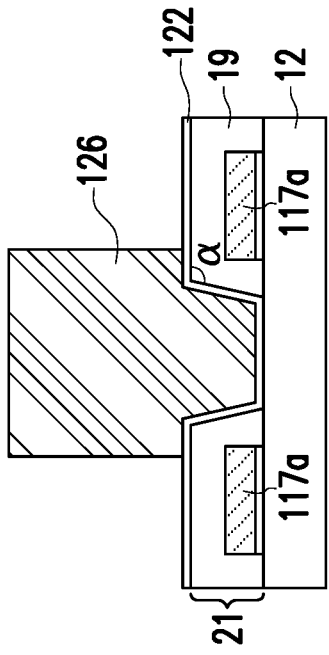
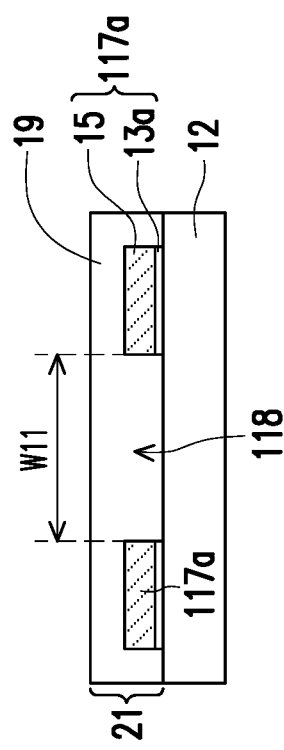
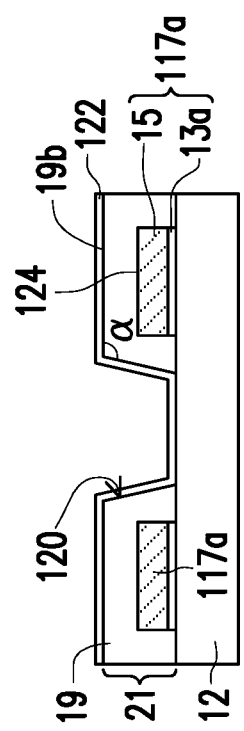
FIG. 3A
FIG. 3B
FIG. 3C

FAN-OUT PACKAGE STRUCTURE AND METHOD OF MANUFACTURING THE SAME

CROSS-REFERENCE TO RELATED APPLICATION

This application is a continuation application of and claims the priority benefit of a prior application Ser. No. 15/706,783, filed on Sep. 18, 2017, now allowed. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness.

BRIEF DESCRIPTION OF THE DRAWINGS

FIG. 1A to FIG. 1L are schematic cross-sectional views illustrating a method of forming a package structure according to a first embodiment of the disclosure.

FIG. 3A to FIG. 3F are schematic cross-sectional views illustrating a method of forming a package structure according to some embodiments of the disclosure.

DETAILED DESCRIPTION

Figure 1C:
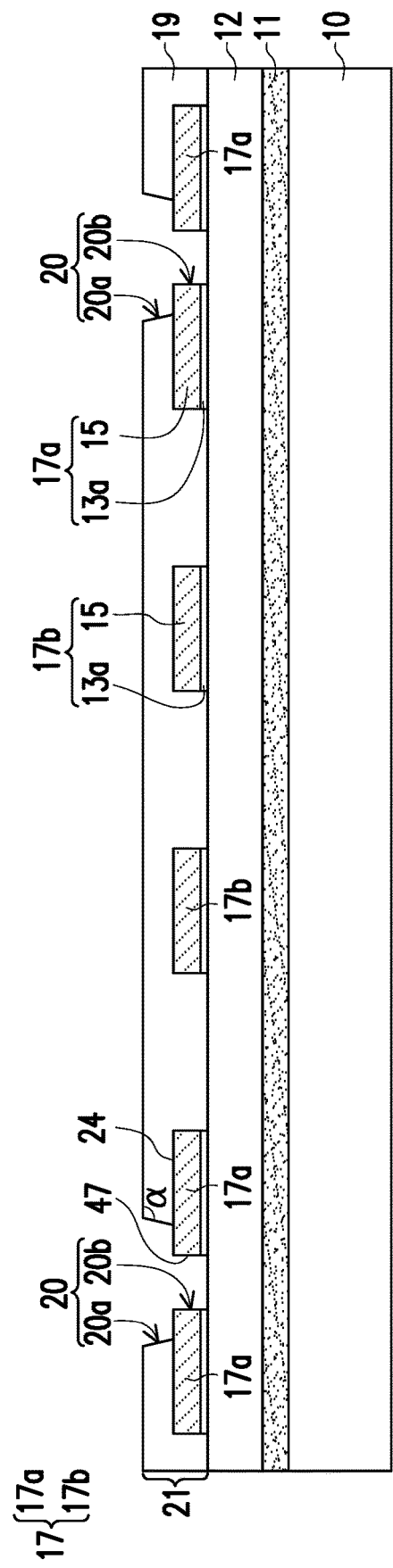

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A to 1L are schematic cross-sectional views illustrating a method of forming a package structure according to a first embodiment of the disclosure.

Referring to FIG. 1A, a carrier 10 is provided. The carrier 10 may be a glass carrier, a ceramic carrier, or the like. A release layer 11 is formed on the carrier 10 by, for example, a spin coating method. In some embodiments, the release layer 11 may be formed of a polymer-based material such as an Ultra-Violet (UV) glue, a Light-to-Heat Conversion (LTHC) material, an epoxy-based thermal-release material, or the like. The release layer 11 is decomposable under the heat of light to thereby release the carrier 10 from the overlying structures that will be formed in subsequent steps.

A dielectric layer 12 (or referred as a first dielectric layer) is formed on the release layer 11. The dielectric layer 12 may be a single layer structure or a multi-layer structure. In some embodiments, the material of the dielectric layer 12 includes an inorganic dielectric material, an organic dielectric material, or a combination thereof. The inorganic dielectric material includes a nitride such as silicon nitride, an oxide such as silicon oxide, an oxynitride such as silicon oxynitride, phosphosilicate glass (PSG), borosilicate glass (BSG), boron-doped phosphosilicate glass (BPSG), or the like, or a combination thereof. The organic dielectric material includes a polymer, which may be a photosensitive material such as polybenzoxazole (PBO), polyimide (PI), benzocyclobutene (BCB), ajinomoto buildup gilm (ABF), solder resist film (SR), or the like, or a combination thereof. The dielectric layer 12 is formed by a suitable fabrication technique such as spin-coating, lamination, deposition, or the like.

Still referring to FIG. 1A, a seed layer 13 is formed on the dielectric layer 12, for example, through physical vapor deposition (PVD). In some embodiments, physical vapor deposition includes sputtering deposition, vapor deposition, or any other suitable method. The seed layer 13 may be a metal seed layer including copper, aluminum, titanium, alloys thereof, or multi-layers thereof. In some embodiments, the seed layer 13 includes a first metal layer such as a titanium layer (not shown) and a second metal layer such as a copper layer (not shown) over the first metal layer. In some embodiments, such the seed layer 13 is a conformal layer. That is, the seed layer 13 has a substantially equal thickness extending along the region on which the seed layer 13 is formed.

Thereafter, a patterned mask layer 14 is formed on the seed layer 13. The patterned mask layer 14 has a plurality of openings 16, exposing a portion of the seed layer 13. The patterned mask layer 14 is, for instance, a photoresist. The patterned mask layer 14 is formed by, for instance, forming a photoresist layer on the seed layer 13 at first, and then performing exposure and development processes on the photoresist layer.

Still referring to FIG. 1A, a conductive layer 15 is formed on the seed layer 13 exposed by the openings 16 through, for example, electroplating, or electroless plating. The conductive layer 15 is formed of, for instance, copper or other suitable metals.

Referring to FIG. 1A and FIG. 1B, the patterned mask layer 14 is then removed by a dry strip, a wet strip or a combination thereof, for example, such that the seed layer 13 not covered by the conductive layer 15 is exposed. In some embodiments, the seed layer 13 not covered by the conductive layer 15 is then removed with the conductive layer 15 as a mask, so as to form a seed layer 13a. In some embodiments, the seed layer 13a may be used as a barrier layer or a glue layer of the conductive layer 15. The removal method includes an etching process, such as a dry etching, a wet etching or a combination thereof.

Referring to FIG. 1B, the seed layer 13a and the conductive layer 15 form a redistribution line (RDL) layer 17. In some embodiments, the RDL layer 17 includes a plurality of conductive traces extending on the dielectric layer 12 connected to each other. In some other embodiments, the RDL layer 17 has a multi-layer structure and includes a plurality of vias and a plurality of conductive traces connected to each other. In some embodiments, the RDL layer 17 includes RDLs 17a and RDLs 17b. Specifically, the RDLs 17a are located at the two sides of the RDLs 17b. The number of the RDLs 17a and RDLs 17b may be adjusted according to the design of products. A plurality of gaps 18 and 18' are existed between the RDLs 17a and 17b. In some embodiments, the gap 18 is existed between the adjacent two RDLs 17a, and the width W0 of the gap 18 ranges from 40 μm to 500 μm. The gap 18' is existed between the adjacent two RDLs 17b or between the adjacent RDL 17a and RDL 17b. In some embodiments, the width of the gap 18' is larger than the width W0 of the gap 18.

Still referring to FIG. 1B, a dielectric layer 19 (or referred as a second dielectric layer) is formed on the dielectric layer 12 and the RDL layer 17, and fills in the gap 18 and 18', so as to cover the dielectric layer 12, the sidewalls 47 of the RDL layer 17 and the top surface 24 of the RDL layer 17. The dielectric layer 19 may be a single layer structure or a multi-layer structure. In some embodiments, the material of the dielectric layer 19 includes an inorganic dielectric material, an organic dielectric material, or a combination thereof. The inorganic dielectric material includes a nitride such as silicon nitride, an oxide such as silicon oxide, an oxynitride such as silicon oxynitride, phosphosilicate glass (PSG), borosilicate glass (BSG), boron-doped phosphosilicate glass (BPSG), or the like, or a combination thereof. The organic dielectric material includes a polymer, which may be a photosensitive material such as polybenzoxazole (PBO), polyimide (PI), benzocyclobutene (BCB), ajinomoto build-up film (ABF), solder resist film (SR), or the like, or a combination thereof. The material of the dielectric layer 19 and the material of the dielectric layer 12 may be the same or different. The dielectric layer 19 is formed by a suitable fabrication technique such as spin-coating, lamination, deposition, or the like. In some embodiments, the RDL layer 17 and the dielectric layer 19 form a RDL structure 21.

Referring to FIG. 1B and FIG. 1C, thereafter, a portion of the second dielectric layer 19 over the gap 18 and the dielectric layer 19 in the gap 18 are removed by, for example, exposure and development processes, laser drilling process, photolithography and etching processes, or a combination thereof, such that a plurality of recesses 20 are formed. The recess 20 penetrates through the RDL structure 21, and exposes a portion of the top surfaces 24 and sidewalls 47 of the two adjacent RDLs 17a, and a portion of the top surface of the dielectric layer 12.

In some embodiments, the recess 20 includes a first recess 20a and a second recess 20b spatially communicated with each other. The first recess 20a is located over the second recess 20b, that is, the first recess 20a and the second recess 20b are overlapped. The width of the first recess 20a is larger than the width of the second recess 20b. The first recess 20a is located over the two adjacent RDLs 17a to expose a portion of the top surfaces 24 of the RDLs 17a. The second recess 20b is located between the two adjacent RDLs 17a to expose the sidewalls 47 of the RDLs 17a and the top surface of the dielectric layer 12.

In some embodiments, the recess 20 has a stepped shape, the cross-section shape of the recess 20 has a T-shape or a funnel-like shape, but the present disclosure is not limited thereto. The sidewall of the first recess 20a (that is the sidewall of the dielectric layer 19) and the top surface 19b of the dielectric layer 19 form a corner α. The angle of the corner α ranges from 100° to 140°.

Figure 1D:
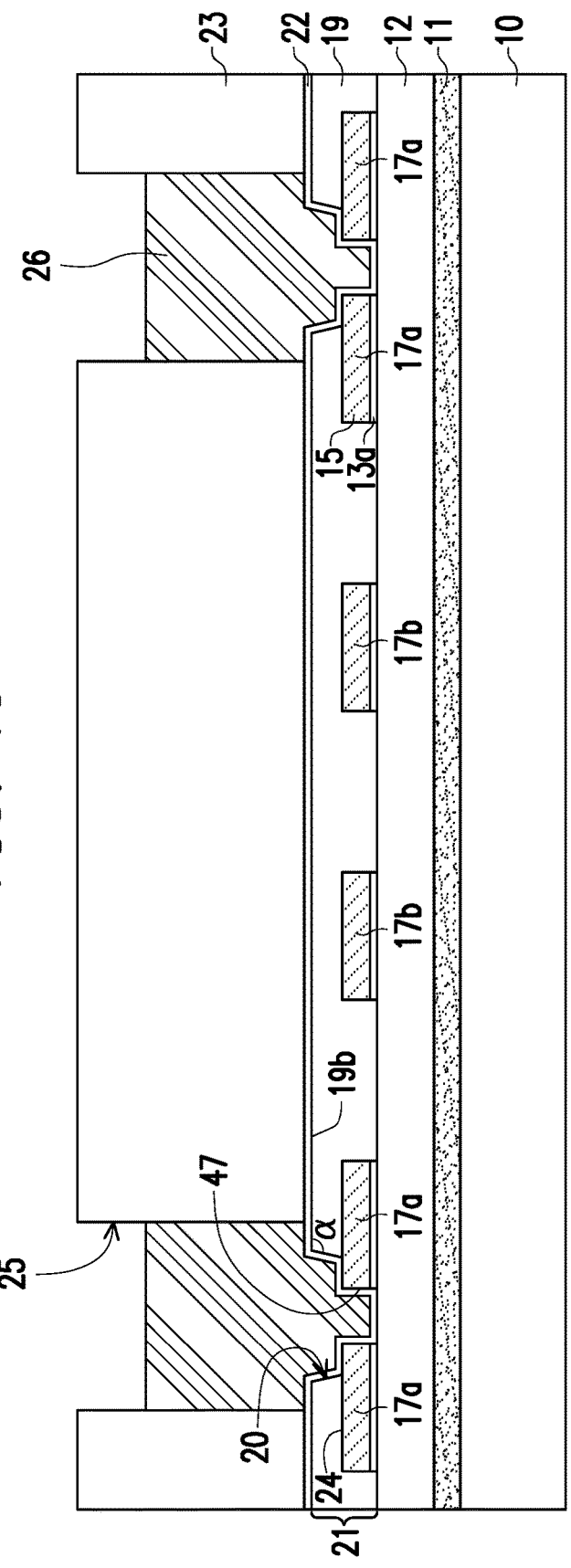

Referring to FIG. 1C to FIG. 1D, a seed layer 22 is then formed on the RDL structure 21 and on the dielectric layer 12. The material and the forming method of the seed layer 22 is substantially the same as those of the seed layer 13 shown in FIG. 1A, which will not be described again. The seed layer 22 covers the top surface 19b of the dielectric layer 19 and covers the bottom surface and sidewalls of the recesses 20. In some embodiments, the seed layer 22 is in contact with a portion of the top surfaces 24 and sidewalls 47 of the RDLs 17a and a portion of the top surface of the dielectric layer 12. The bottom surface of the seed layer 22 is substantially level with the bottom surface of the seed layer 13a of the RDLs 17a.

Referring to FIG. 1D, a patterned mask layer 23 is formed on the seed layer 22. The patterned mask layer 23 has a plurality of openings 25. The opening 25 exposes the seed layer 22 located in the recesses 20 and the seed layer 22 covering the corner α of the dielectric layer 19.

Still referring to FIG. 1D, a plurality of conductive posts 26 are formed on the seed layer 22 exposed by the openings 25 of the patterned mask 23. The conductive post 26 is disposed in the recess 20 and protrudes from the top surface 19b of the dielectric layer 19. The conductive post 26 may be a copper post or any other suitable metal post. The term "copper posts" refers to copper protrusions, copper through vias, thick copper pads, and/or copper-containing protrusions. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum, or zirconium, etc. The conductive post 26 is formed by electroplating, for example.

Figure 1E:
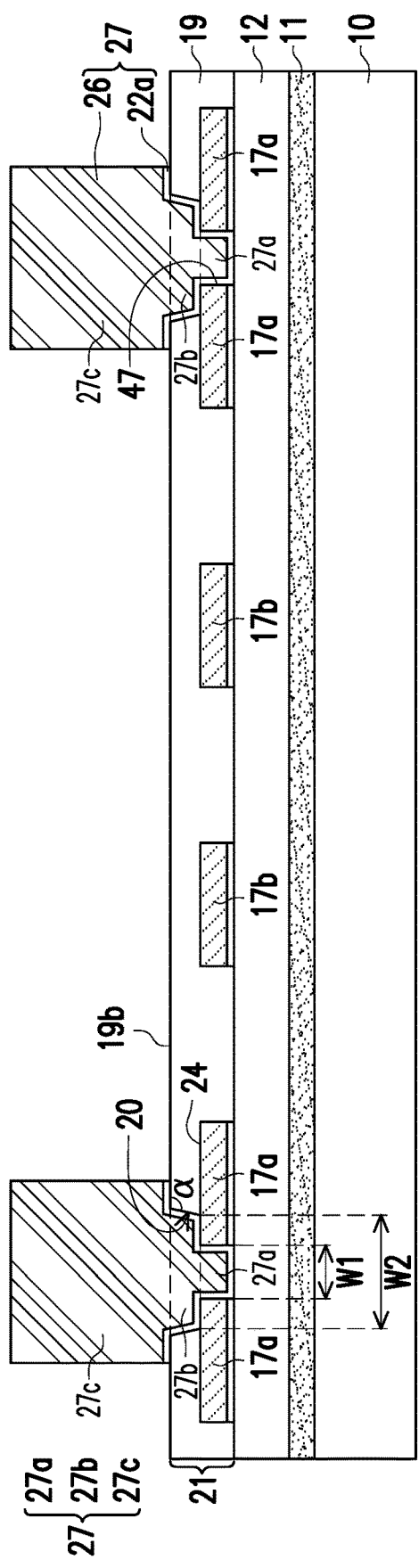

Referring to FIG. 1D and FIG. 1E, the patterned mask layer 23 is then removed, such that the seed layer 22 not covered by the conductive posts 26 is exposed. The seed layer 22 not covered by the conductive posts 26 is then removed with the conductive posts 26 as a mask, so as to form a seed layer 22a. In some embodiments, the seed layer 22a may be used as a barrier layer or a glue layer of the conductive post 26. The removal method includes an etching process, such as a day etching, a wet etching, or a combination thereof.

Referring to FIG. 1E, the seed layer 22a and the overlying conductive posts 26 form a plurality of through integrated fan-out vias (TIVs) 27. The number of the TIVs 27 is not limited to that is shown in FIG. 1E, which may be adjusted according to the requirement. The TIV 27 is disposed in the recess 20, and protrudes from the top surface 19b of the dielectric layer 19. The TIV 27 penetrates through the RDL structure 21 and contacts with the dielectric layer 12. In other words, the TIV 27 is engaged with the RDL structure 21. Further, the TIV 27 is in electrical contact with a portion of the top surfaces 24 and the sidewalls 47 of the two adjacent RDLs 17a.

Still referring to FIG. 1E, in some embodiments, an end of the TIV 27 (that is, the bottom of the TIV 27) has a stepped shape and is engaged with the RDL structure 21. Specifically, the seed layer 22a and an end of the conductive post 26 have stepped shapes. A portion of sidewalls and bottoms of the conductive post 26 is covered by the seed layer 22a. Another end of the TIV 27, that is, another end of the conductive post 26 is flat. The TIV 27 includes, from bottom to top, a first embedded part 27a, a second embedded part 27b and a protruding part 27c which are in electrical contact with each other. The first embedded part 27a and the second embedded part 27b are located in the recess 20. The protruding part 27c is located over the RDL structure 21 to protrude from the top surface 19b of the dielectric layer 19.

Specifically, the first embedded part 27a is located between the two adjacent RDLs 17a and in electrical contact with the sidewalls 47 of the RDLs 17a. The top surface of the first embedded part 27a is substantially level with the top surface 24 of the RDLs 17a, the bottom surface of the first embedded part 27a is substantially level with the bottom surface of the RDLs 17a and in contact with the dielectric layer 12. The second embedded part 27b is located on the first embedded part 27a and on the two adjacent RDLs 17a to be in electrical contact with a portion of the top surfaces 24 of the two adjacent RDLs 17a. In some embodiments, the cross-section shape of the first embedded part 27a is square or rectangle. The cross-section shape of the second embedded part 27b is inverted trapezoid or rectangle. The overall cross-section shape of the first embedded part 27a and the second embedded part 27b has a T-shaped or a funnel-like shape. In some embodiments, the bottom width W2 of the second embedded part 27b is equal to or larger than the top width W1 of the first embedded part 27a, such that the bottom of the TIV has a stepped shape. In some exemplary embodiments, the bottom width W2 of the second embedded part 27b ranges from 50 µm to 510 µm, the top width W1 of the first embedded part 37a substantially equals to the width W0 of the gap 18 (shown in FIG. 1B) and ranges from 40 µm to 500 µm.

The protruding part 27c is located on the second embedded part 27b. In some embodiments, the protruding part 27c covers the top surface of the second embedded part 27b and a portion of the top surface 19b of the dielectric layer 19, that is to say, the corner α of the dielectric layer 19 is covered by the TIV 27, but the disclosure is not limited thereto. In some other embodiments, the protruding part 27c only covers the top surface of the second embedded part 27b and does not cover the top surface 19b of the dielectric layer 19 (not shown). In some embodiments, the cross-section shape of the protruding part 27c is rectangle or trapezoid, but the disclosure is not limited thereto.

Figure 1F:
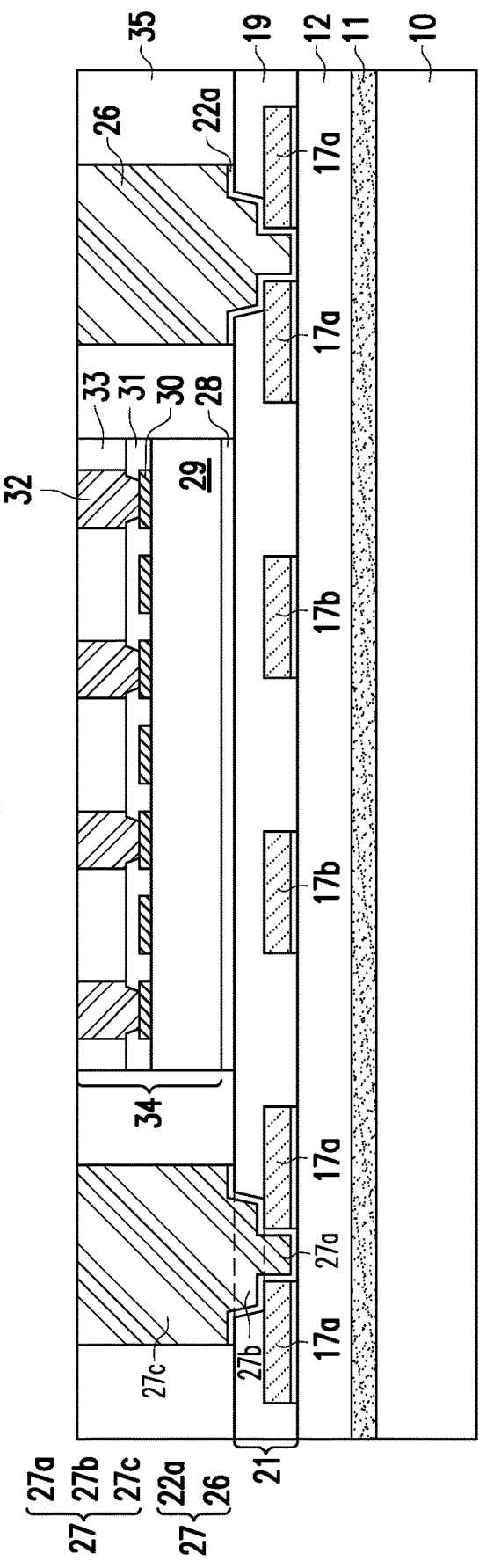

Referring to FIG. 1F, a die 34 is attached to the dielectric layer 19 though an adhesive film 28 such as a die attach film (DAF), and disposed between the TIVs 27. The die 34 includes a substrate 29, a plurality of pads 30, a passivation layer 31, a plurality of connectors 32 and a passivation layer 33. The pads 30 may be a part of an interconnection structure (not shown) and electrically connected to the integrated circuit devices (not shown) formed on the substrate 29. The passivation layer 31 is formed over the substrate 29 and covers a portion of the pads 30. A portion of the pads 30 is exposed by the passivation layer 31 and serves as an external connection of the die 34. The connectors 32 is formed on and electrically connected to the pads 30 not covered by the passivation layer 31. The connectors 32 include solder bumps, gold bumps, copper bumps, copper posts, or the like. The passivation layer 33 is formed over the passivation layer 31 and aside the connectors 32 to cover the sidewalls of the connectors 32. The passivation layer 31 and 33 respectively includes an insulating material such as silicon oxide, silicon nitride, polymer, or a combination thereof. In some embodiments, the top surface of the passivation layer 33 is substantially level with the top surface of the connectors 32.

In some embodiments, the die 34 is one of a plurality of dies cut apart from a wafer, for example. The die 34 may be an application-specific integrated circuit (ASIC) chip, an analog chip, a sensor chip, a wireless and radio frequency chip, a voltage regulator chip or a memory chips. The number of the die 34 shown in FIG. 1F is merely for illustration, and the disclosure is not limited thereto. In some embodiments, two or more dies 34 may be mounted onto the dielectric layer 19, and the two or more dies 34 may be the same types of dies or the different types of dies. In some other embodiments, a wafer (not shown) comprising a plurality of dies 34 arranged in an array is mounted onto the dielectric layer 19, and the die 34 is surrounded by the TIVs 27.

An encapsulant 35 is then formed over the carrier 10 to encapsulate the sidewalls of the die 34 and the protruding parts 27c of the TIVs 27. In some embodiments, the encapsulant 35 includes a molding compound, a molding underfill, a resin such as epoxy, a combination thereof, or the like. In some other embodiments, the encapsulant 35 includes a photo-sensitive material such as PBO, polyimide, BCB, a combination thereof, or the like, which may be easily patterned by exposure and development processes. In alternative embodiments, the encapsulant 35 includes nitride such as silicon nitride, oxide such as silicon oxide, PSG, BSG, BPSG, a combination thereof, or the like. The encapsulant 35 is formed by forming an encapsulant material layer over the carrier 10 by a suitable fabrication technique such as spin-coating, lamination, deposition, or similar processes. The encapsulant material layer encapsulates the top surfaces and sidewalls of the die 34 and the protruding part 27c of the TIVs 27. Thereafter, a grinding or polishing process is performed to remove a portion of the encapsulant material layer, such that the top surfaces of the connectors 32 and the TIVs 27 are exposed. In some embodiments, the top surfaces of the connectors 32, the TIVs 27 and the encapsulant 35 are substantially coplanar.

Figure 1G:
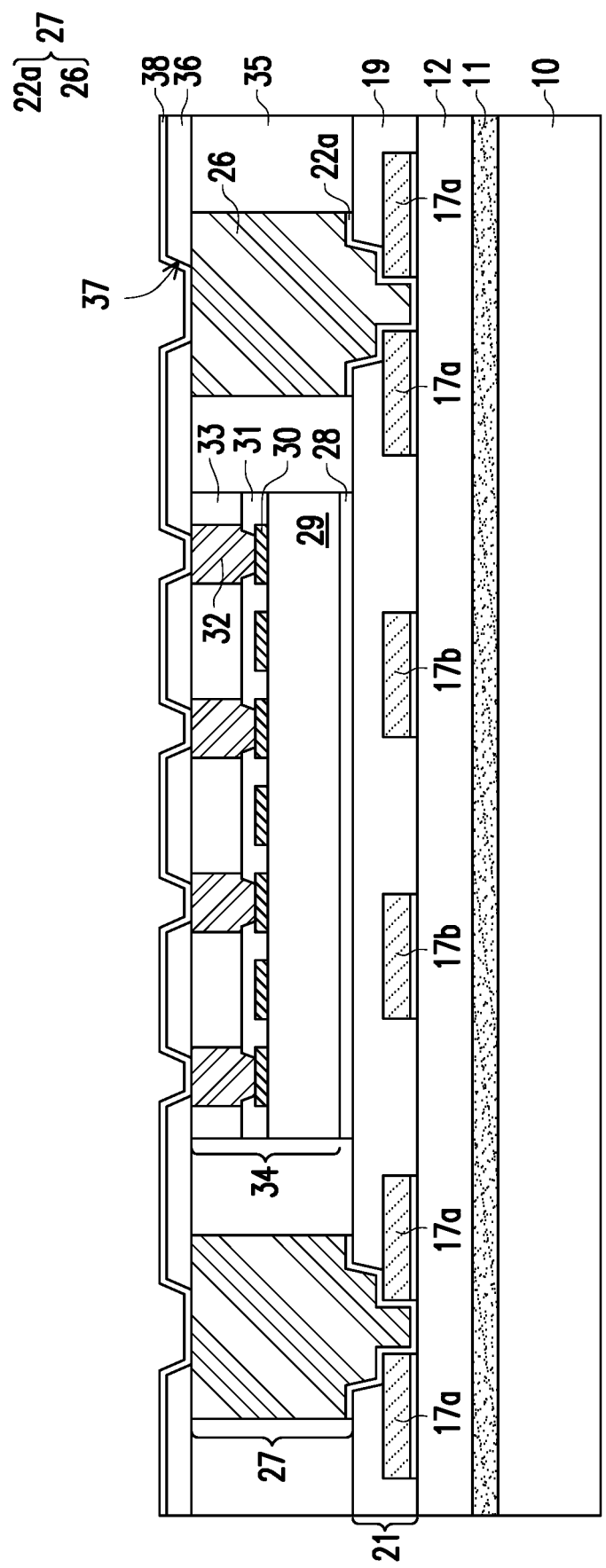

Referring to FIG. 1G, a first dielectric layer 36 is formed on the die 34 and the TIVs 27 and the encapsulant 35. The first dielectric layer 36 may be a single layer structure or a multi-layer structure. The first dielectric layer 36 has a plurality of openings 37, exposing a portion of the TIVs 27 and a portion of the connectors 32 of the die 34. The material of the first dielectric layer 36 is similar to that of the dielectric layer 12 and the dielectric layer 19. The first dielectric layer 36 is formed by forming a first dielectric material layer (not shown) at first to cover the die 34, the encapsulant 35 and the TIVs 27. Thereafter, a portion of the dielectric material layer on the TIVs 27 and on the connectors 32 is removed by, for example, exposure and development processes, a laser drilling process, photolithography and etching processes, or a combination thereof, such that the first dielectric layer 36 having the openings 37 is formed.

Still referring to FIG. 1G, a seed layer 38 is formed on the first dielectric layer 36, and fills into the openings 37 to cover the bottom surface and sidewalls of the openings 37. The seed layer 38 is in electrical contact with the TIVs 27 and the connectors 32 at the bottom of the openings 37. The material and the forming method of the seed layer 38 are similar to those of the seed layer 13 shown in FIG. 1A.

Figure 1H:
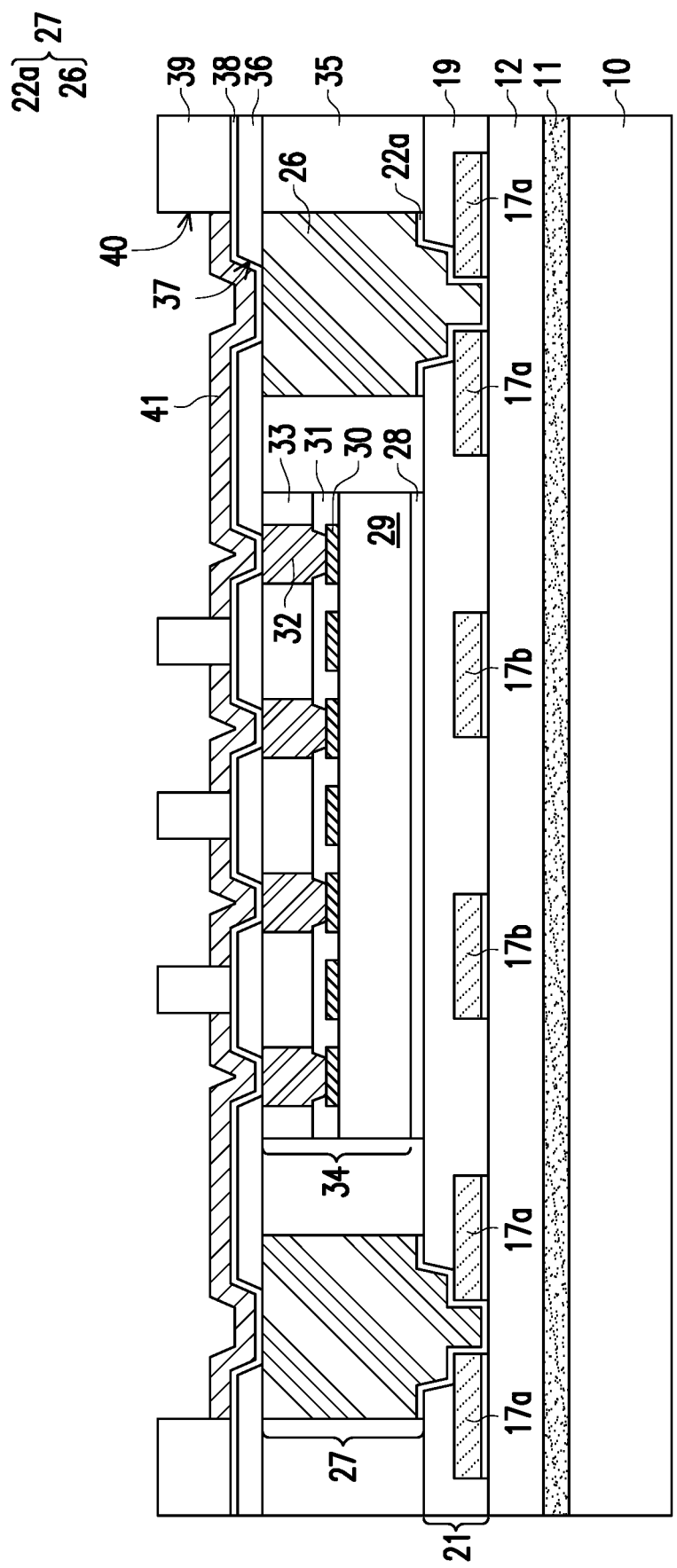

Referring to FIG. 1H, a patterned mask layer 39 is formed on the seed layer 38. The patterned mask layer 39 has a plurality of openings 40, exposing the seed layer 38 in the openings 37 and a portion of the seed layer 38 on the first dielectric layer 36. A conductive layer 41 is then formed on the seed layer 38 exposed by the openings 40. The conductive layer 41 fills into the openings 37 and protrudes from the top surface of the first dielectric layer 36, and covers a portion of the top surface of the first dielectric layer 36.

Figure 1I:
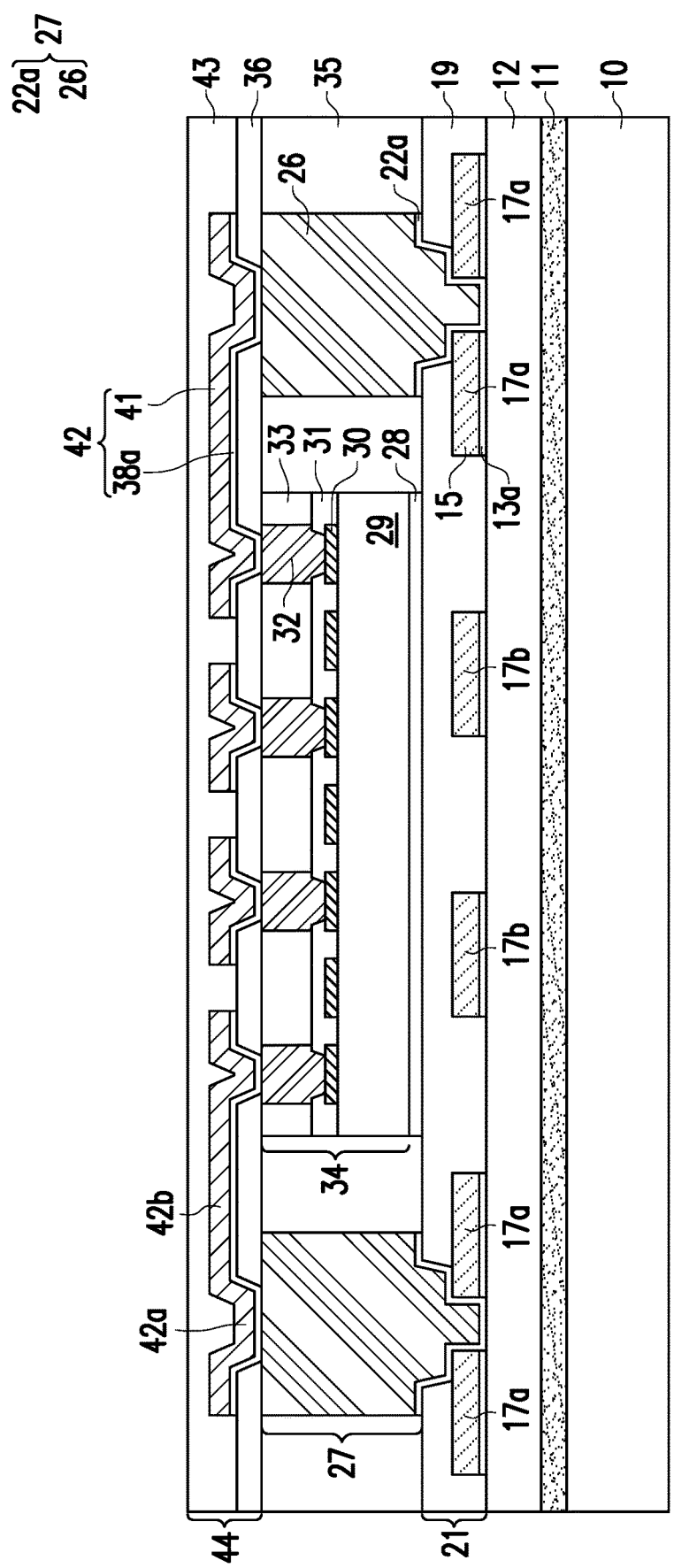

Referring to FIG. 1H and FIG. 1I, the patterned mask layer 39 is then removed, such that the seed layer 38 not covered by the conductive layer 41 is exposed. The seed layer 38 not covered by the conductive layer 41 is then removed with the conductive layer 41 as a mask, so as to form a seed layer 38a. The removal method includes an etching process, such as a dry etching, a wet etching, or a combination thereof.

Referring to FIG. 1I, the seed layer 38a and the conductive layer 41 form a RDL layer 42. In some embodiments, the RDL layer 42 is in contact with and electrically connected to the TIVs 27 and the connectors 32 of the die 34. In some embodiments, the RDL layer 42 includes a plurality of vias 42a and a plurality of conductive traces 42b. The vias 42a penetrate through the first dielectric layer 36 to contact with the TIVs 27 and the connectors 32. The conductive traces 42b extend on the first dielectric layer 36 and are connected to the vias 42a. Thereafter, a second dielectric layer 43 is formed on the RDL layer 42, so as to cover the top surface and sidewalls of the RDL layer 42. The material and the forming method of the second dielectric layer 43 are similar to those of the dielectric layer 12, which will not be described again.

The first dielectric layer 36, the RDL layer 42 and the second dielectric layer 43 form a RDL structure 44. The number of the layers of the RDL layer 42 of the RDL structure 44 is not limited to that is shown in FIG. 1I, and may be adjusted according to the requirements. The RDL structure 44 may have one or more layers of RDL layer 42. In some embodiment in which the RDL structure 44 has more than one RDL layers 42, the RDL structure 44 includes a plurality of stacked dielectric layers 36 and 43 and RDL layers 42 (not shown). The method of forming the multilayer structure of the RDL structure 44 is, for instance, after the second dielectric layer 43 is formed, repeating the processes from FIG. 1G to FIG. 1I described above to form multi-layers of RDL layers 42.

Still referring to FIG. 1I, the RDL structure 44 is disposed at the front side of the die 34 (the side close to the connectors 32, that is, close to an active surface of the die 34), the RDL structure 21 is disposed at the back side (the opposite side of the front side) of the die 34. Therefore, in some embodiments, the RDL structure 21 is referred as the back side RDL structure, and the RDL structure 44 is referred as the front side RDL structure.

Figure 1J:
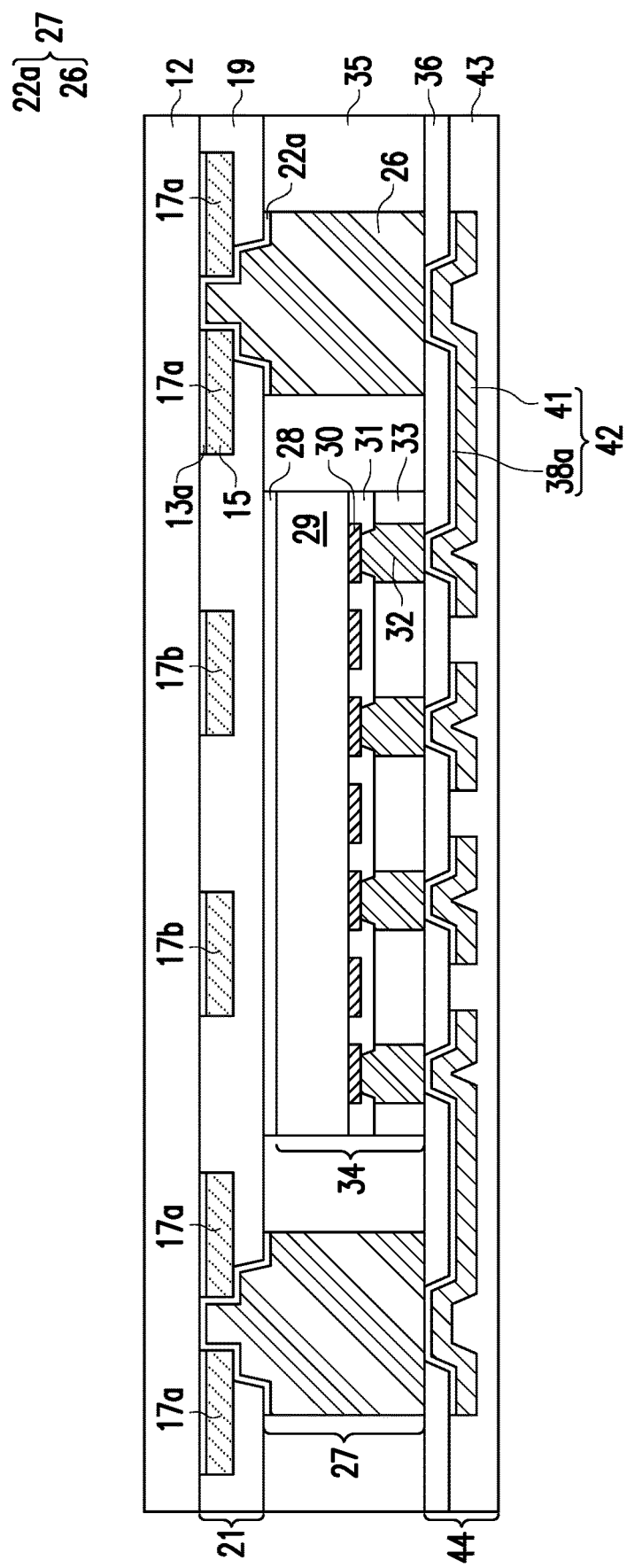

Referring to FIG. 1I and FIG. 1J, the structure formed in FIG. 1I is turned over, the release layer 11 is decomposed under the heat of light, and the carrier 10 is then released from the overlying structure thereof.

Figure 1K:
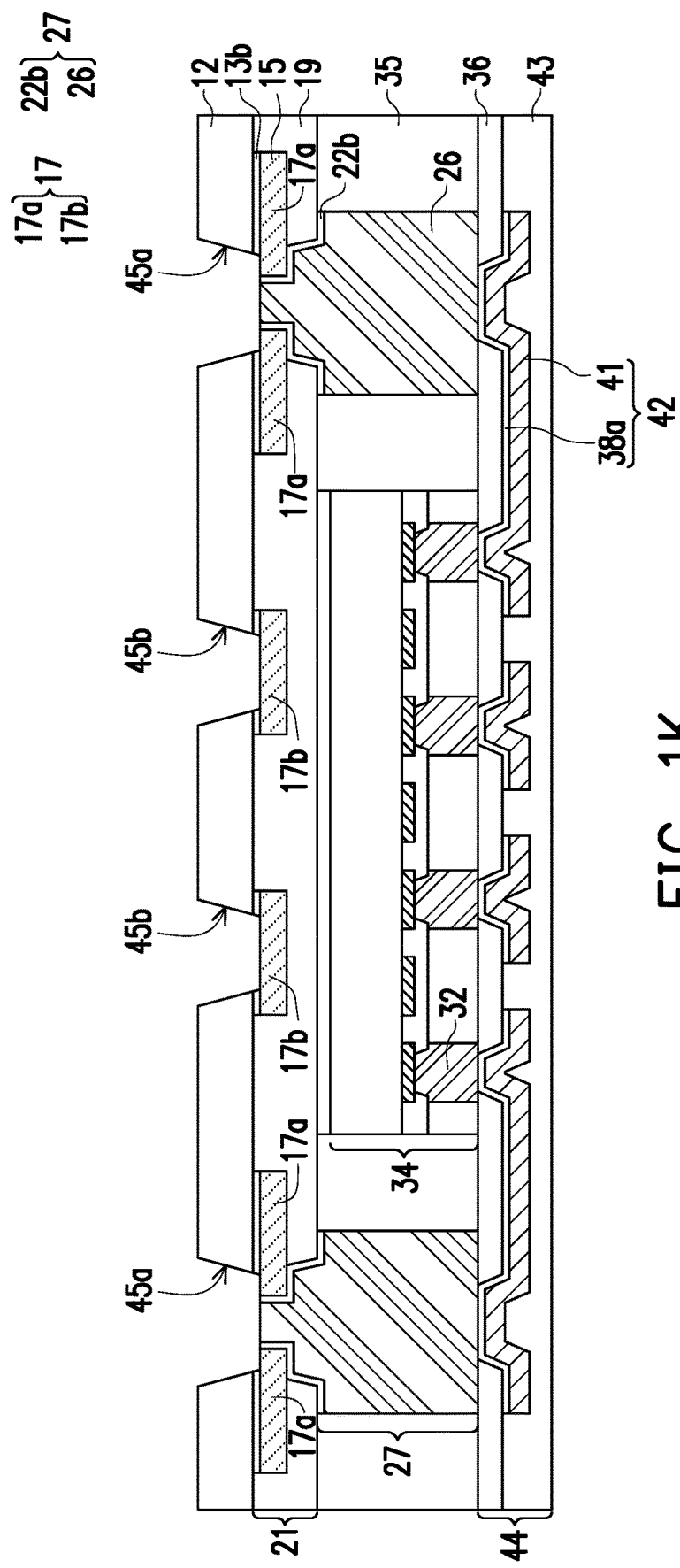

Still referring to FIG. 1J and FIG. 1K, a portion of the dielectric layer 12, a portion of the seed layer 13a, and the seed layer 22a at the top of the TIVs 27 are removed to form a plurality of openings 45a. The opening 45a penetrates through the dielectric layer 12 of the RDL structure 21 and the seed layer 13a of the RDLs 17a. Further, portions of the dielectric layer 12 on the RDLs 17b and the underlying seed layer 13a are removed to form a plurality of openings 45b. The opening 45b penetrates through the dielectric layer 12 and the seed layer 13a of the RDLs 17b. The removal method includes a laser drilling process, for example. A seed layer 13b of the RDL layer 17 and a seed layer 22b of the TIV 27 are remained. A portion of sidewalls of the conductive post 26 is covered by the seed layer 22b. The conductive post 26 is separated from the dielectric layer 19 by the seed layer 22b therebetween. The bottom of the opening 45a exposes the seed layer 22b and the conductive post 26 of the TIV 27 and a portion of the top surface of the conductive layer 15 of the RDLs 17a, and the sidewalls of the opening 45a expose the seed layer 13b of the RDLs 17a and the dielectric layer 12. The width of the opening 45a may be adjusted, as long as at least a portion of the conductive post 26 is exposed by the bottom of the opening 45a. The bottom of the opening 45b exposes the conductive layer 15 of the RDL 17b, and the sidewalls of the opening 45b expose the dielectric layer 12 and the seed layer 13b of the RDL 17b. In some embodiments in which the seed layer 13 (shown in FIG. 1A) and the seed layer 22 (shown in FIG. 1D) are formed with a same thickness, the top surface of the conductive post 26 and the top surface of the seed layer 22b are coplanar with the top surface (the surface in contact with the seed layer 13b) of the conductive layer 15, but the disclosure is not limited thereto.

Figure 1L:
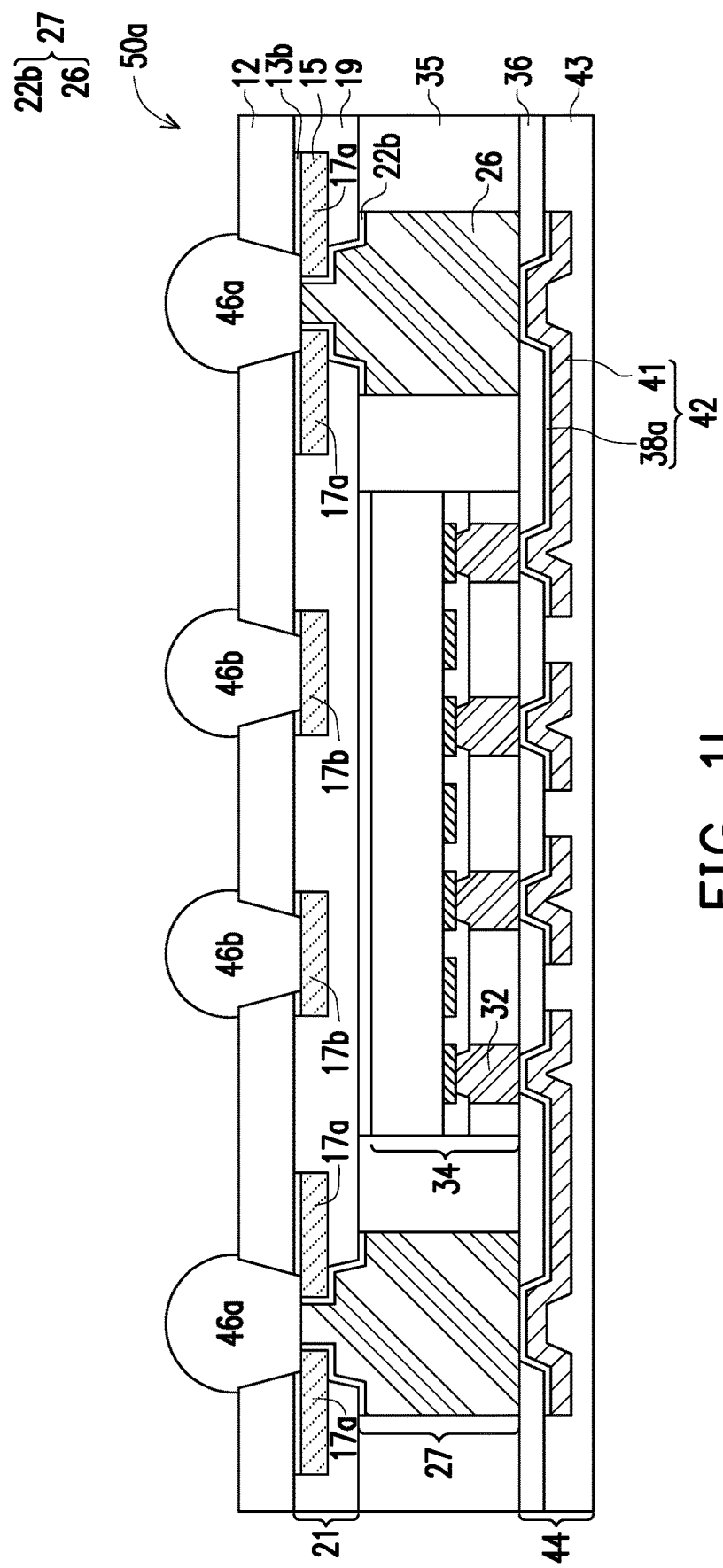

Referring to FIG. 1K and FIG. 1L, a plurality of connectors 46a and 46b are respectively formed on TIVs 27 and on the RDLs 17b. The connectors 46a and 46b may be referred as conductive terminals. In some embodiments, the connectors 46a and 46b may cover a portion of a top surface of the dielectric layer 12. In some other embodiments, the connectors 46a and 46b may not cover the top surface of the dielectric layer 12. The connectors 46a and 46b may be simultaneously formed or successively formed. The connector 46a fills into the opening 45a and penetrates through the dielectric layer 12 and the seed layer 13b of the RDLs 17a. The bottom of the connector 46a is in electrical contact with the conductive post 26 and the seed layer 22b of the TIV 27, and the conductive layer 15 of the RDLs 17a. The sidewalls of the connector 46a are in contact with the seed layer 13b of the RDLs 17a and the dielectric layer 12. The connector 46b fills into the opening 45b so that the bottom of the connector 46b is in electrical contact with the conductive layer 15 of the RDL 17b, and the sidewalls of the connector 46b are in contact with the seed layer 13b of the RDL 17b and the dielectric layer 12. The material of the connector 46a and 46b include copper, aluminum, lead-free alloys (e.g., gold, tin, silver, aluminum, or copper alloys) or lead alloys (e.g., lead-tin alloys). In some embodiments, the connectors 46a and 46b are respectively formed by a ball mounting process. In some other embodiments, a printing step may be performed to print a solder paste in the openings 45a and 45b, followed by reflowing the solder paste to form the connectors 46a and 46b. Alternatively, connectors 46a and 46b are formed by dropping solder balls in openings 45a and 45b and then a reflow process is performed. In some embodiments, an under-ball metallurgy (UBM) layer (not shown) is further formed before the connectors 46a and 46b are formed. The UBM layer fills into the openings 45a and 45b, and covers the bottom and sidewalls of the openings 45a and 45b and a portion of the dielectric layer 12.

Still referring to FIG. 1L, a package structure 50a is thus completed. The package structure 50a includes the die 34, the RDL structure 21, the TIVs 27, the RDL structure 44 and the connectors 46a and 46b. The TIVs 27 penetrates through the RDL structure 21 and are in electrical contact with the connectors 46a. Thereafter, the package structure 50a may be connected to other package components such as a printed circuit board (PCB), a flex PCB, or the like through the connectors 46a and 46b. In some embodiments in which a wafer comprising a plurality of dies 34 is formed over the carrier 10 in the forgoing process, before connecting to other package components, the package structure (not shown) may be singulated by a die-saw process to form a plurality of identical package structures 50a as illustrated in FIG. 1L.

Figure 2A:
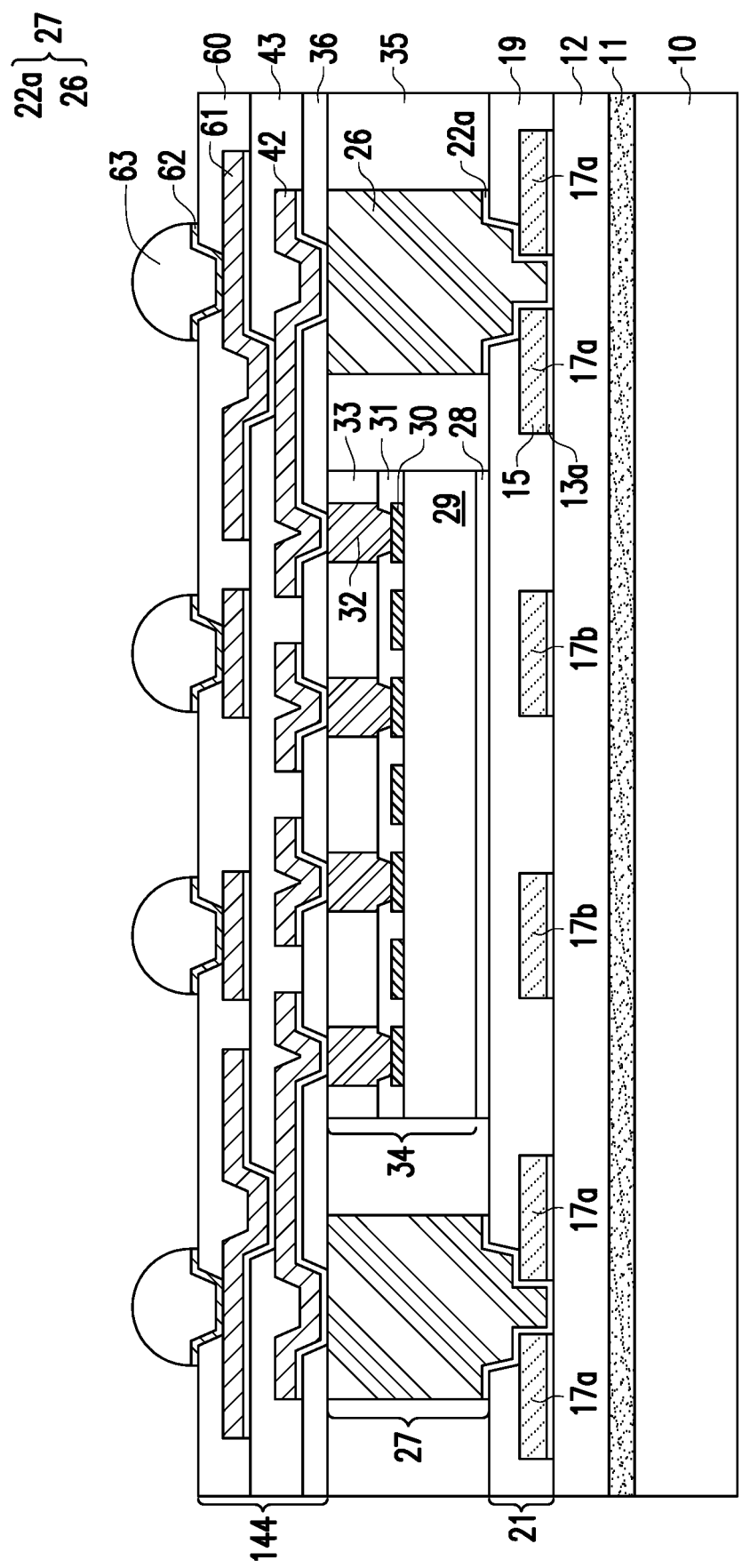
FIG. 2A to FIG. 2C are schematic cross-sectional views illustrating a method of forming a package structure according to a second embodiment of the disclosure.
Figure 2B:
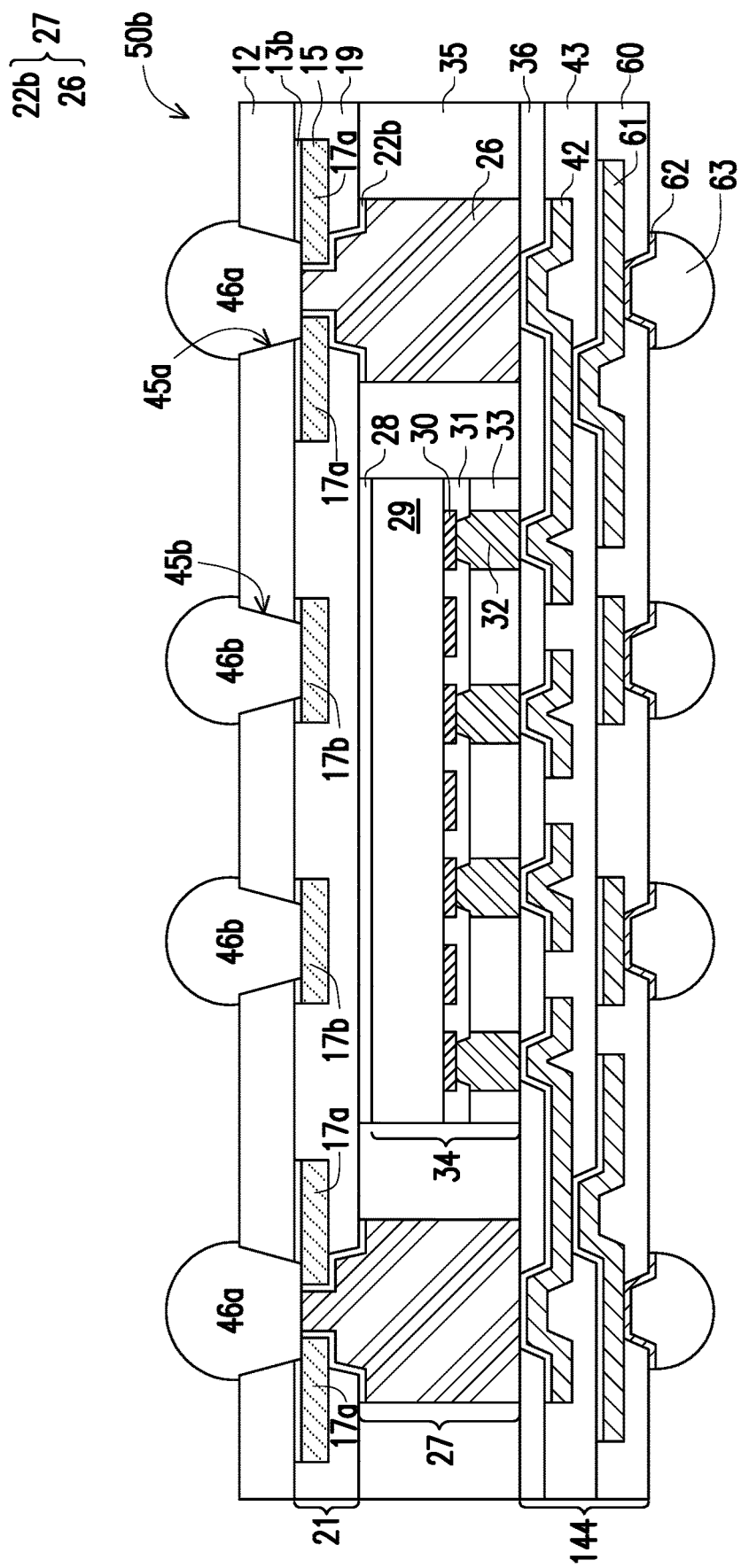
Figure 2C:
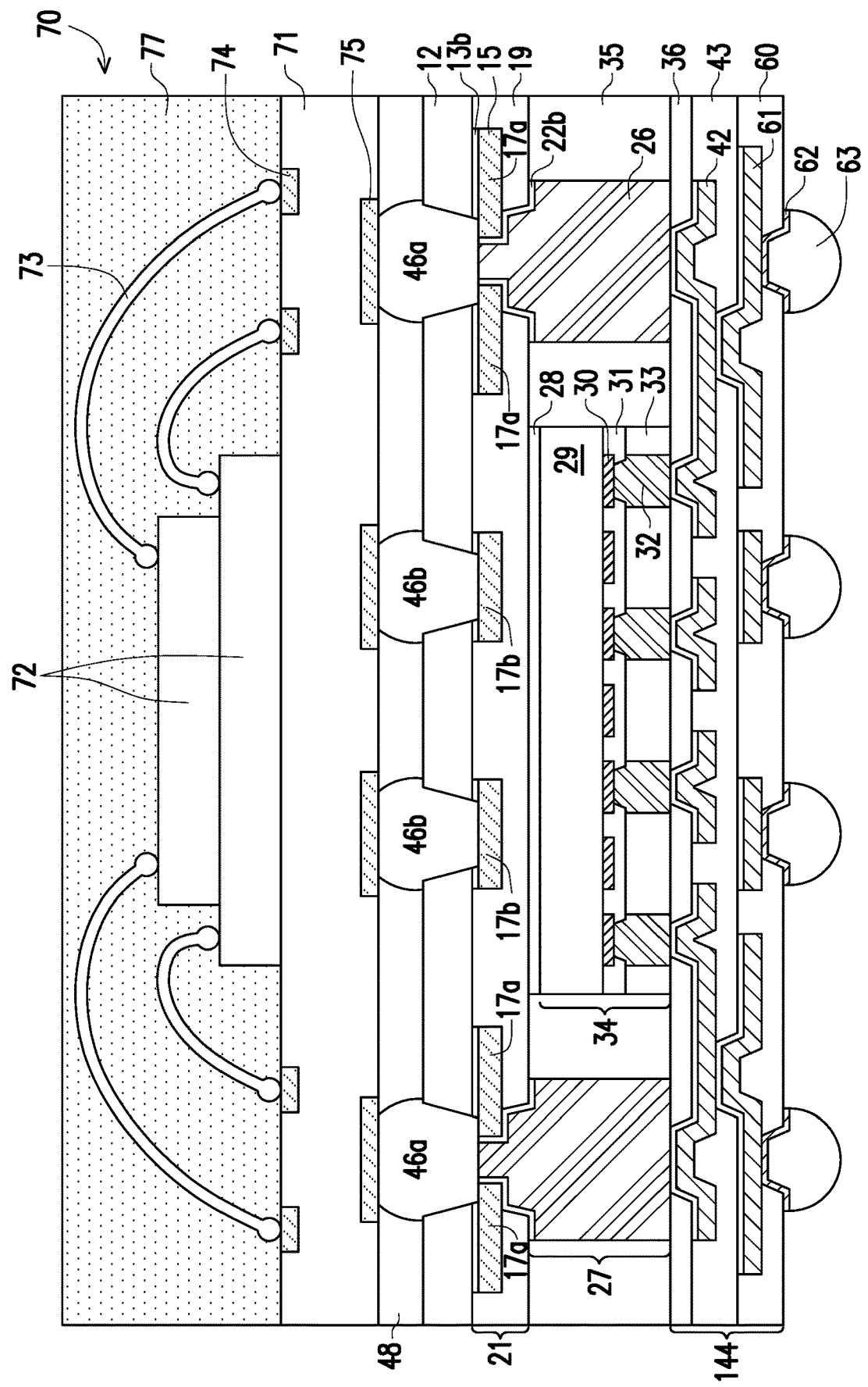

FIGS. 2A to 2C are schematic cross-sectional views illustrating a method of forming a package structure according to a second embodiment of the disclosure. The second embodiment differs from the first embodiment in that connectors 63 are further formed to connect to a RDL structure 144 over the die 34, and a package-on-package (POP) device is further formed. The details are described as below.

Referring to FIG. 1I and FIG. 2A, in some embodiments, the RDL structure 144 includes a plurality of RDL layers 42/61 and dielectric layers 36/43/60 stacked alternately, and the RDL layer 42 is referred as a first RDL layer 42. In some embodiments, after the first dielectric layer 36, the first RDL layer 42, and the second dielectric layer 43 are formed as shown in FIG. 1I, processes similar to those of FIG. 1G to FIG. 1I are performed, so as to form a second RDL layer 61 and a third dielectric layer 60. The second RDL layer 61 penetrates through the second dielectric layer 43 to connect to the first RDL layer 42. The material, forming method and structural characteristics of the second RDL layer 61 and the third dielectric layer 60 are similar to those of the first RDL layer 42 and the second dielectric layer 43, which will not be described again.

Thereafter, a conductive layer 62 penetrating though the third dielectric layer 60 is formed to connect to the second RDL layer 61. In some embodiments, the conductive layer 62 is referred as under-ball metallurgy (UBM). The material of the conductive layer 62 includes a metal or a metal alloy. The conductive layer 62 is, for example, copper, tin, an alloy thereof, or a combination thereof. The conductive layer 62 is formed by, for instance, physical vapor deposition or electroplating.

Still referring to FIG. 2A, a plurality of connectors (also referred to as conductive balls) 63 are placed on the conductive layer 62. The material of the connector 63 includes copper, aluminum, lead-free alloys (e.g., gold, tin, silver, aluminum, or copper alloys) or lead alloys (e.g., lead-tin alloys). In some embodiments, the connectors 63 are placed on the conductive layer 62 by a ball mounting process. The connectors 63 are electrically connected to the connectors 32 through the conductive layer 62 and the RDL structure 144.

Referring to FIG. 2A and FIG. 2B, processes similar to those of FIGS. 1J to 1L are then performed, the structure formed in FIG. 2A is turned over, the release layer 11 is decomposed, and the carrier 10 is then released from the overlying structure thereof.

Referring to FIG. 2B, a plurality of openings 45a and 45b are formed. Thereafter, a plurality of connectors 46a penetrating through the dielectric layer 12 and the seed layer 13b of the RDLs 17a are formed to be in electrical contact with the TIVs 27 and the RDLs 17a. A plurality of connectors 46b penetrating through the dielectric layer 12 is formed to be in electrical contact with the RDLs 17b. The connectors 46a and 46b may be simultaneously formed or successively formed. The forming method and the structural characteristics of the openings 45a and 45b and the connectors 46a and 46b are substantially the same as those in the first embodiment, which will not be described again.

The package structure 50b is thus completed. In some embodiments, the package structure 50b may further be electrically coupled to a package structure 70 to form a POP device, but the disclosure is not limited thereto.

Referring to FIG. 2C, in some embodiments, the package structure 70 has a substrate 71, and a die 72 is mounted on one surface (e.g. top surface) of the substrate 71. Bonding wires 73 are used to provide electrical connections between the die 72 and pads 74 (such as bonding pads) on the same top surface of the substrate 71. TIVs (not shown) may be used to provide electrical connections between the pads 74 and pads 75 (such as bonding pads) on an opposing surface (e.g. bottom surface) of the substrate 71. The connectors 46a and 46b connect the pads 75 and electrically connect to the package structure 50b. An encapsulant 77 is formed over the components to protect the components from the environment and external contaminants.

Thereafter, an under-fill layer 48 is formed to fill the space between the package structure 50b and the package structure 70 and to surround the connectors 46a and 46b. In some embodiments, the under-fill layer 48 includes a molding compound such as epoxy, and is formed using dispensing, injecting, and/or spraying techniques.

FIG. 3A to FIG. 3F are schematic cross-sectional views illustrating a method of forming a package structure according to some embodiments of the disclosure.

In the forgoing embodiments, as shown in FIG. 1L and FIG. 2B, the TIV 27 penetrates through the RDL structure 21 to be in electrical contact with the connector 46a, and the TIV 27 and the connector 46a are also in electric contact with the conductive layer 15 and the seed layer 13b of the RDLs 17a. Referring to FIG. 3A to FIG. 3F, in some embodiments, there may be some TIVs 127 that is not in contact with an RDL 117a, but separated from the RDLs 117a by the dielectric layer 19, and the connector 46a is not in contact with the RDLs 117a. For the sake of brevity, FIGS. 3A to 3E only show the RDLs 117a, a TIV 127, the encapsulant 35 and a connector 146a.

Referring to FIG. 1B, FIG. 3A and FIG. 3B, the RDL structure 21 further includes RDLs 117a, and a gap 118 is existed between the adjacent two RDLs 117a. A portion of the dielectric layer 19 within the gap 118 is removed, so as to form a recess 120 penetrating through the dielectric layer 19. The recess 120 is located between the adjacent two RDLs 117a. In some embodiments, the bottom of the recess 120 exposes a portion of the top surface of the dielectric layer 12. As the dielectric layer 19 in the gap 118 is partially removed, such that the RDLs 117a is not exposed in the recess 120. In some embodiments, the cross-section shape of the recess 120 is inverted trapezoid, square, rectangle, or any other shape, as long as the surfaces of the RDLs 117a are covered by the dielectric layer 19. Thereafter, a seed layer 122 is formed on the dielectric layer 19.

Figure 3F:
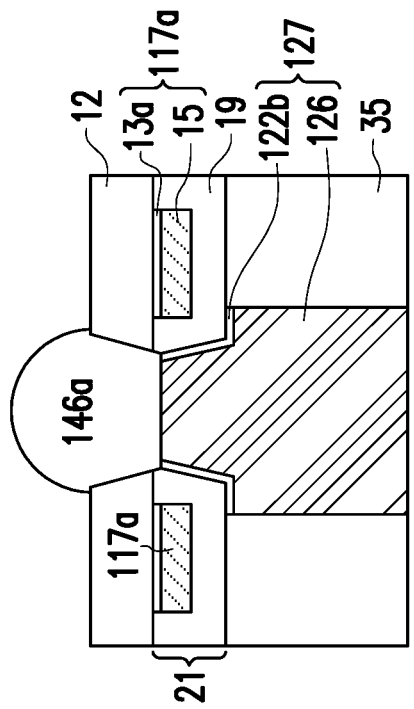
Figure 3D:
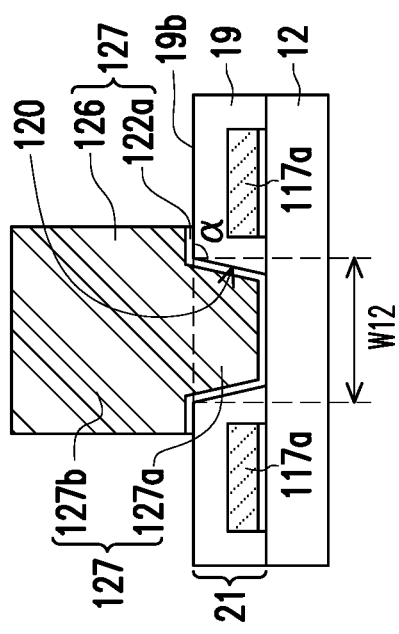

Referring to FIGS. 3B to 3D, processes similar to those of FIGS. 1D to 1E are performed to form a TIV 127. The TIV 127 including a conductive post 126 and a seed layer 122a. The material and the forming method are substantially the same as those of the TIV 27, which will not be described again. The TIV 127 penetrates through the RDL structure 21 and is in contact with the dielectric layer 12. The TIV 127 differs from the TIV 27 of the foregoing embodiments in that the TIV 127 is not in electrical contact with the RDLs 117a, but separated from the RDLs 117a by the dielectric layer 19. In some embodiments, the TIV 127 includes an embedded part 127a and a protruding part 127b. The embedded part 127a is located in the recess 120, and the top surface of the embedded part 127a is substantially level with the top surface 19b of the dielectric layer 19. In some embodiments, the cross-section shape of the embedded part 127a is inverted trapezoid, square or rectangle, but the disclosure is not limited thereto. In some embodiments in which the embedded part 127a has an inverted trapezoid cross-section shape, the top width W12 of the embedded part 127a is less than the width W11 of the gap 118 as shown in FIG. 3A. The protruding part 127b is located on the embedded part 127a and protrudes from the top surface 19b of the dielectric layer 19. The other structural characteristics of the protruding part 127b are similar to those of the TIV 27 as shown in FIG. 1E.

Figure 3E:
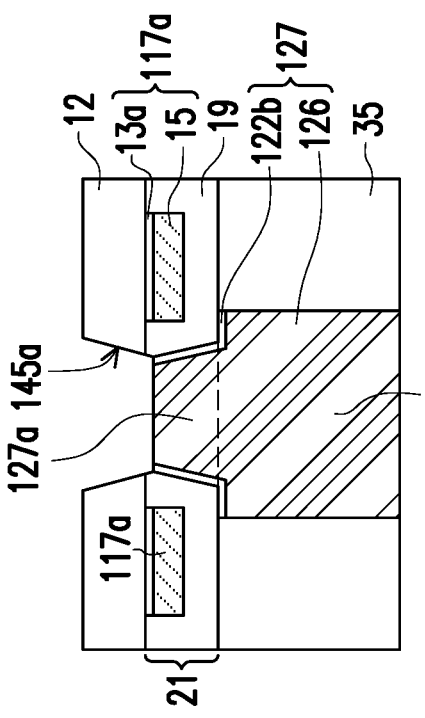

Referring to FIG. 1J, FIG. 3D and FIG. 3E, after the carrier 10 is released, a portion of the dielectric layer 12, and the seed layer 122a covering the top surface of the conductive post 126 are removed, so as to form an opening 145a penetrating through the dielectric layer 12, and a seed layer 122b of the TIV 127 is remained. A portion of sidewalls of the embedded part 127a is covered by the seed layer 122b, and the top surface of the embedded part 127a is exposed by the opening 145a. The width of the opening 145a may be adjusted, as long as at least a portion of the conductive post 126 is exposed by the bottom of the opening 145a.

The conductive post 126 is separated from the dielectric layer 19 by the seed layer 122b therebetween. In some embodiments, the cross-section shape of the seed layer 122b is L shaped or line-shaped, but the disclosure is not limited thereto.

In some embodiments, the cross-section shape of the opening 145a is inverted trapezoid or rectangle, for example, but the disclosure is not limited thereto. The bottom of the opening 145a exposes the conductive post 126 and the seed layer 122b of the TIV 127. In some embodiments, the top surface of the conductive post 126 and the top surface of the seed layer 122b are substantially coplanar with the conductive layer 15 of the RDLs 117a. Referring to FIG. 3F, a connector 146a is formed on the TIV 127. The connector 146a may be referred as a conductive terminal. The connector 146a penetrates through the dielectric layer 12, and the bottom of the connector 146a is in electrical contact with the conductive post 126 and the seed layer 122b of the TIV 127. The connector 146a and the RDLs 117a are separated by the dielectric layer 19 therebetween.

In some embodiments of the present disclosure, the TIV is provided to penetrate through the RDL structure to be in contact with and electrically connected to the connector, thus the open issue between the TIV and the RDL structure that caused by the seed layer or barrier layer or glue layer is avoided. On the other hand, as the seed layer is partially removed, a portion of the seed layer is still disposed between the conductive post of the TIV and the dielectric layer, thus the delamination problem is also avoided.

In accordance with some embodiments of the disclosure, a package structure includes a die, a redistribution layer (RDL) structure, a through integrated fan-out via (TIV) and a conductive terminal. The RDL structure is disposed on and electrically connected to the die. The TIV is laterally aside the die and extends to contact a bottom surface and a sidewall of a redistribution layer of the RDL structure. The conductive terminal is electrically connected to the die through the RDL structure and the TIV.

In accordance with alternative embodiments of the disclosure, a package structure includes a die, a RDL structure and a TIV. The RDL structure is connected to the die, and a redistribution layer of the RDL structure includes a first seed layer and a conductive layer, the first seed layer is on the conductive layer. The TIV is laterally aside and extends into the RDL structure. The TIV includes a second seed layer and a conductive post, the second seed layer is on the conductive post. The TIV has a top surface substantially coplanar with a top surface of the conductive layer of the redistribution layer.

In accordance with some embodiments of the disclosure, a method of manufacturing a package structure includes: forming a RDL structure, wherein the RDL structure includes a redistribution layer embedded in a dielectric layer, wherein the redistribution layer includes a first seed layer and a conductive layer; attaching a die on the RDL structure; forming a TIV laterally aside the die and extending into the RDL structure, the TIV includes a second seed layer and a conductive post; removing a portion of the first seed layer to expose a portion of the conductive layer; and forming a conductive terminal to be in contact with the portion of the conductive layer.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a die;
   a redistribution layer (RDL) structure disposed on and electrically connected to the die, wherein the RDL structure comprises a dielectric layer and a redistribution layer embedded in the dielectric layer;
   a through integrated fan-out via (TIV) laterally aside the die and extending to contact a bottom surface and a sidewall of the redistribution layer of the RDL structure, wherein a portion of the dielectric layer is vertically sandwiched between the redistribution layer and the TIV; and
   a conductive terminal, electrically connected to the die through the RDL structure and the TIV.

2. The package structure of claim 1, wherein a top surface of the TIV is higher than the bottom surface of the redistribution layer and lower than a topmost surface of the dielectric layer.

3. The package structure of claim 1, wherein a bottom corner of the dielectric layer is covered by the TIV.

4. The package structure of claim 1, wherein the redistribution layer comprises a first seed layer and a conductive layer, and a portion of the conductive layer is separated from the first seed layer.

5. The package structure of claim 4, wherein there is free of seed layer between the conductive terminal and the conductive layer of the redistribution layer.

6. The package structure of claim 1, wherein the TIV comprises a second seed layer and a conductive post, the second seed layer and the conductive post are in physical contact with the conductive terminal.

7. The package structure of claim 6, wherein a portion of the second seed layer is laterally between the redistribution layer and the conductive post, and vertically between the redistribution layer and the conductive post.

8. The package structure of claim 1, wherein
the TIV comprises a first portion laterally aside the die, a second portion laterally aside the redistribution layer, and a third portion vertically between the first portion and the second portion; and
a width of the third portion is less than a width of the first portion and larger than a width of the second portion.

9. A package structure, comprising:
a die;
a redistribution layer (RDL) structure connected to the die, wherein the RDL structure comprises a redistribution layer having a first seed layer and a conductive layer, the first seed layer is on the conductive layer; and
a through integrated fan-out via (TIV) laterally aside the die and extending into the RDL structure, the TIV comprises a second seed layer and a conductive post, the second seed layer is on the conductive post,
wherein the TIV has a top surface substantially coplanar with a top surface of the conductive layer of the redistribution layer.

10. The package structure of claim 9, wherein the top surface of the TIV comprises a top surface of the conductive post and a top surface of the second seed layer coplanar with each other.

11. The package structure of claim 9, wherein the first seed layer has a width less than a width of the conductive layer.

12. The package structure of claim 9, further comprising a conductive terminal electrically connected to the die through the RDL structure and the TIV, wherein the conductive terminal has a bottom surface lower than a top surface of the first seed layer of the redistribution layer.

13. The package structure of claim 12, wherein the bottom surface of the conductive terminal is in contact with the conductive layer and the conductive post.

14. The package structure of claim 9, wherein the TIV covers a bottom corner of the redistribution layer.

15. The package structure of claim 9, wherein the RDL structure further comprises a dielectric layer, and the redistribution layer is embedded in the dielectric layer, a portion of the dielectric layer is vertically sandwiched between the redistribution layer and the TIV.

16. The package structure of claim 15, wherein the top surface of the TIV is lower than a top surface of the dielectric layer.

17. A method of manufacturing a package structure, comprising:
forming an intermediate structure, comprising:
forming a RDL structure, wherein the RDL structure comprises a redistribution layer embedded in a dielectric layer, wherein the redistribution layer comprises a first seed layer and a conductive layer;
attaching a die on the RDL structure; and
forming a TIV laterally aside the die and extending into the RDL structure, the TIV comprises a second seed layer and a conductive post;
turning over the intermediate structure, such that the first seed layer is on the conductive layer, and the second seed layer is on the conductive post;
removing a portion of the first seed layer to expose a portion of the conductive layer; and
forming a conductive terminal to be in contact with the portion of the conductive layer,
wherein the TIV has a top surface substantially coplanar with a top surface of the conductive layer of the redistribution layer, and the RDL structure is connected to the die.

18. The method of claim 17, further comprising removing a portion of the second seed layer to expose a portion of the conductive post, and the conductive terminal is further formed to be in contact with the portion of the conductive post.

19. The method of claim 17, wherein the forming the TIV comprises:
patterning the dielectric layer to form a recess in the RDL structure, wherein the recess exposes a sidewall and a corner of the redistribution layer;
forming the second seed layer in the recess and on the dielectric layer; and
forming the conductive post on the second seed layer.

20. The method of claim 17, wherein the second seed layer is formed to have a thickness substantially the same as a thickness of the first seed layer.

* * * * *